(12) United States Patent  
Yang et al.

(10) Patent No.: US 7,777,296 B2
(45) Date of Patent: Aug. 17, 2010

(54) NANO-FUSE STRUCTURAL ARRANGEMENTS HAVING BLOW PROTECTION BARRIER SPACED FROM AND SURROUNDING FUSE LINK

(75) Inventors: Haining S. Yang, Wappingers Falls, NY (US); Jack A. Mandelman, Flat Rock, NC (US)

(73) Assignee: International Business Machines Corporation, Armonk, NY (US)

( * ) Notice: Subject to any disclaimer, the term of this patent is extended or adjusted under 35 U.S.C. 154(b) by 615 days.

(21) Appl. No.: 11/566,865

(22) Filed: Dec. 5, 2006

(65) Prior Publication Data

US 2008/0128771 A1     Jun. 5, 2008

(51) Int. Cl.
  *H01L 23/525* (2006.01)
(52) U.S. Cl. ............... 257/529; 257/619; 257/E23.149
(58) Field of Classification Search .............. 257/529, 257/379, 619, E23.149
  See application file for complete search history.

(56) References Cited

U.S. PATENT DOCUMENTS

| 6,028,339 | A  | 2/2000  | Frenette et al. |
| 6,548,877 | B2 | 4/2003  | Yang et al. |
| 6,611,039 | B2 | 8/2003  | Anthony |
| 6,624,499 | B2 | 9/2003  | Kothandaraman et al. |
| 6,870,361 | B2 | 3/2005  | Chopra et al. |
| 6,944,054 | B2 | 9/2005  | Rueckes et al. |
| 7,009,222 | B2 | 3/2006  | Yang |
| 2003/0211724 | A1* | 11/2003 | Haase .................. 438/629 |
| 2004/0219794 | A1* | 11/2004 | Buchanan et al. ......... 438/706 |
| 2005/0104056 | A1 | 5/2005  | Nihei |
| 2005/0167755 | A1 | 8/2005  | Dubin et al. |
| 2005/0275010 | A1 | 12/2005 | Chen et al. |
| 2006/0193093 | A1 | 8/2006  | Bertin et al. |

OTHER PUBLICATIONS

Wolfgang Hoenlein et al., "Carbon Nanotube Applications in Microelectronics", IEEE Transactions on Components and Packaging Technologies, vol. 27, No. 4, Dec. 2004, pp. 629-634.

(Continued)

*Primary Examiner*—Anh Phung
*Assistant Examiner*—Allison P Bernstein
(74) *Attorney, Agent, or Firm*—Joseph P. Abate; Daryl Neff

(57) ABSTRACT

A nano-fuse structural arrangement, includes, for example, a semiconductor substrate having an electrically conductive region formed thereon; an electrically conductive elongated nano-structure having a maximum diameter of less than approximately 50 nm and a maximum length of approximately 250 nm and being formed on the electrically conductive region; a barrier having barrier parts completely spaced from and completely surrounding elongated outer surfaces of the nano-structure, the spaces between the barrier and surfaces consisting essentially of a vacuum and being approximately equally spaced, so that the electrically conductive elongated nano-structure is blowable responsive to an electrical current flowable there through in a range of approximately 4 µA to approximately 120 µA.

21 Claims, 24 Drawing Sheets

OTHER PUBLICATIONS

T.I. Kamins et al., "Metal-Catalyzed Silicon Nanowires: Control and Connection (Invited)", Proceedings of 2005 5th IEEE Conference on Nanotechnology, Nagoya, Japan, Jul. 2005, 4 pages.

Takeshi Kawano et al., "Selective Vapor-Liquid-Solid Epitaxial Growth of Micro-Si Probe Electrode Arrays with On-Chip MOSFETs on Si (111) Substrates", IEEE Transactions on Electron Devices, vol. 51, No. 3, Mar. 2004, pp. 415-420.

Yi-Han Yang et al., "Catalytic Syntheses of Silicon Nanowires and Silica Nanotubes", 2004 4th IEEE Conference on Nanotechnology, pp. 448-450.

K.P. Yung et al., "Electrodes Plating of Nickel on Carbon Nanotubes Film", 2005 Electronics Packaging Technology Conference, pp. 636-638.

* cited by examiner

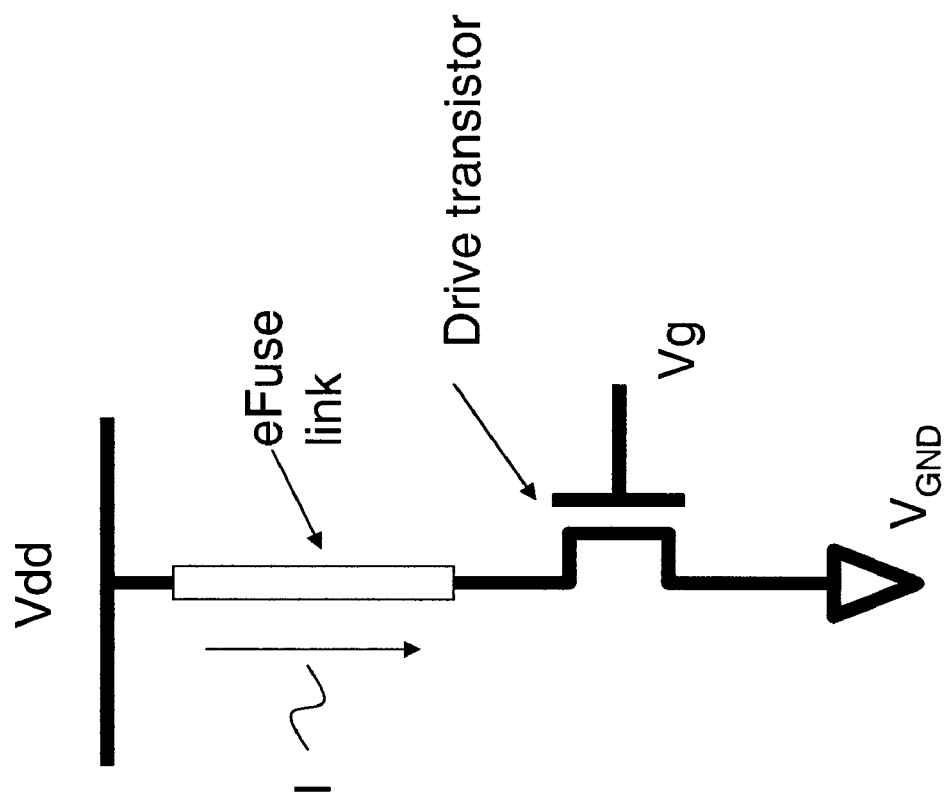

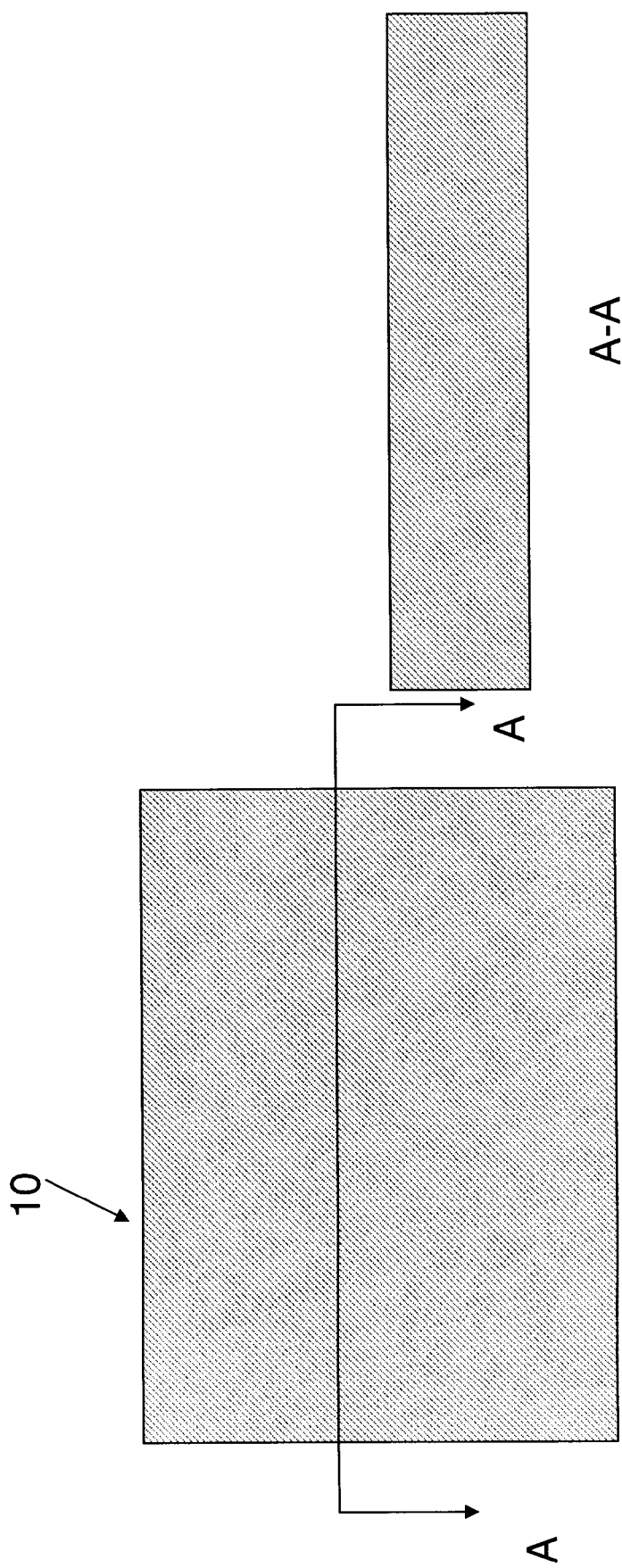

NANO-FUSE STRUCTURAL ARRANGEMENTS HAVING BLOW PROTECTION BARRIER SPACED FROM AND SURROUNDING FUSE LINK

FIELD OF THE INVENTION

The present invention relates generally to nano-fuse structures and, more particularly, to arrangements including nano-fuse structures and having fuse blow protection for adjacent devices or other structures.

BACKGROUND OF THE INVENTION

As electronic circuit dimensions decrease, demand for higher densities of active and passive device structures increases. Various nano-fuse structures and their arrangements are known and include, for example, a blowable link having a maximum cross sectional diameter of approximately (±10%) 50 nm and typically approximately 20 nm. The link includes one or more electrically conductive materials and may be blown, for example, by flowing an excessive electrical current through the link. The electrically conductive materials include, for example, metals, metal silicides or conductive (e.g., doped) semiconductors. FIG. 1 shows a schematic circuit diagram of a conventional electrically programmable fuse (eFuse) arrangement, such as a nano-fuse structure connected to a drive transistor, wherein Vdd is approximately three (3) volts and wherein a current I of approximately four (4) ma will blow the link.

Conventional or known fuses, eFuses or nano-fuse structural arrangements are taught, for example, in U.S. Pat. No. 6,624,499 B2, issued Sep. 23, 2003, SYSTEM FOR PROGRAMMING FUSE STRUCTURE BY ELECTROMIGRATION OF SILICIDE ENHANCED BY CREATING TEMPERATURE GRADIENT, by Kothandaraman et al.; U.S. Pat. No. 6,611,039 B2, issued Aug. 26, 2003, VERTICALLY ORIENTED NANO-FUSE AND NANO-RESISTOR CIRCUIT ELEMENTS, by Thomas C. Anthony, and U.S. Pat. No. 7,009,222 B2, issued Mar. 7, 2006, PROTECTIVE METAL STRUCTURE AND METHOD TO PROTECT LOW-K DIELECTRIC LAYER DURING FUSE BLOW PROCESS, by Chao-Hsiang Yang, which are all incorporated in their entireties herein by reference.

During a fuse link blow, metal or other particulate materials are discharged (e.g., blown) from the link and can affect nearby devices or other structures. Also, material in contact or in very close proximity with the fuse link can raise the electrical power or current necessary to blow or break the fuse link.

Several known arrangements to address effects of fuse link blow include, for example: the U.S. Pat. No. 7,009,222 B2 to Yang, which discloses a guard ring comprising a metal interconnect structure surrounding the fuse portion in an uppermost intermetal dielectric (IMD) layer, and the U.S. Pat. No. 6,611,039 B2 to Anthony, which discloses a nano-fuse spacer surrounding an insulating plug which may be voided to provide space for molten or evaporated fuse material to enter. See, for example, col. 5, lines 1-8 of the '039 Patent to Anthony.

Although helpful, these known arrangements in the present inventors' opinions have not proven to be entirely satisfactory because, for example, the present inventors believe portions of the fuse link to be blown remain in intimate physical contact with various materials such as a low k dielectric material.

This intimate physical contact affects the power or current necessary to blow the fuse link, in addition to other drawbacks such as affecting the contacted (e.g. dielectric) layer because of contamination from the particulate and other materials discharged during blow or break of the fuse link.

The present inventors believe these and other drawbacks are overcome in accordance with the present invention.

Therefore, it is a principal object of the present invention to provide a nano-fuse structural arrangement which lowers the electrical power or current necessary to blow or break the fuse link.

It is a further object of the present invention to provide a nano-fuse structural arrangement which reduces adverse effects to devices or other structures surrounding the fuse link caused by materials discharged by fuse link blow.

It is an additional object of the present invention to provide methods of manufacturing and operating such nano-fuse structural arrangements.

SUMMARY OF THE INVENTION

The foregoing and other objects of the present invention are achieved in a nano-fuse structural arrangement which includes a semiconductor substrate having an electrically conductive region formed thereon; an electrically conductive elongated nano-structure having a maximum diameter of less than approximately 50 nm and a maximum length of less than approximately 250 nm and being formed on the electrically conductive region; a barrier having barrier parts completely spaced from and completely surrounding major elongated surfaces of the nano-structure, the spaces between the barrier parts and major elongated surfaces consisting essentially of a vacuum and being approximately equally spaced, so that the electrically conductive elongated nano-structure is blowable responsive to an electrical current flowable therethrough in a range of approximately 4 µA to approximately 120 µA.

In another embodiment of the invention the spaces consist essentially of a fluid such as air or an inert gas, instead of consisting essentially of a vacuum.

Embodiments of the present invention include the nano-structure being a nano-wire, a nano-tube or even a damascene formed electrical conductor. The nano-wire or nano-tube is, for example, suitably doped/implanted with a conductive dopant such as As, P, or metals such as Ni, Ti, or W, and/or is suitably provided (e.g., plated) with an electrically conductive external layer such as Ti, Ta, Ni, or W.

The barrier parts form, for example, a cylindrical cavity or via. Embodiments of the present invention include the nano-structure being disposed at and extending from an approximately central location on the conductive region within the cavity, so that major elongated surfaces of the nano-structure are approximately equally spaced from the barrier parts.

The present invention further includes methods of manufacturing and operating nano-fuse structural arrangements.

Beneficially, because the major portions of the nano-structure (such as a nano-wire or nano-tube) are completely spaced from the surrounding barrier walls (e.g., dielectric) by spaces consisting essentially of a vacuum or a suitable insulative fluid (e.g., ambient air or an inert gas), power or current requirements for fuse link blow are reduced and damage to surrounding structures (e.g., the dielectric barrier) and any adjacent devices (e.g., transistor) are lessened.

ADDITIONAL BACKGROUND OF THE INVENTION

However, the present inventors have become aware of U.S. Patent Application Publication No. US 2005/0104056 A1, ELECTRONIC DEVICE USING CARBON ELEMENT LINEAR STRUCTURE AND PRODUCTION METHOD THEREOF, by Mizuhisa Nihei, published May 19, 2005, filed Jun. 18, 2003 which is incorporated herein in its entirety by reference. The Nihei publication discloses an electronic device including one or more carbon nano-tubes vertically grown on silicide layers exposed inside via-holes. See, for example, FIG. 4C, paragraph [0037] and paragraph [0038] of the Nihei publication.

BRIEF DESCRIPTION OF THE DRAWINGS

The various features and aspects of the present invention will become more readily apparent when the following detailed description is taken in conjunction with the following drawings, in which:

FIG. 1 shows a generic schematic circuit diagram of convention semiconductor eFuse structural arrangement;

FIGS. 2A, 2B, 3A and 3B are top planar and side sectional schematic views of sequential intermediate structural arrangements formed while practicing methods for producing final embodiments of arrangements according to the present invention as shown in FIGS. 12, 17 and 23;

DETAILED DESCRIPTION

Turning now to the Figures, and to FIGS. 2-12 in particular, there are shown various intermediate sequential structural arrangements which result during steps to produce a first embodiment (FIG. 10, 11 or 12) of a nano-fuse structural arrangement according to the present invention. Only those features or aspects of the embodiments necessary for understanding the present invention will be described in any detail. Those skilled in the art will readily know and understand the various techniques and tools useful for practicing the methods and producing the arrangements according to the present invention, in view of the instant specification and drawing figures.

In FIG. 2A and the cross-sectional view through a line A-A (FIG. 2B), a semiconductor substrate 10 is provided. The substrate 10 is a bulk silicon, but alternatively is a silicon-on-insulator (SOI) or another suitable substrate.

Figure 3B:
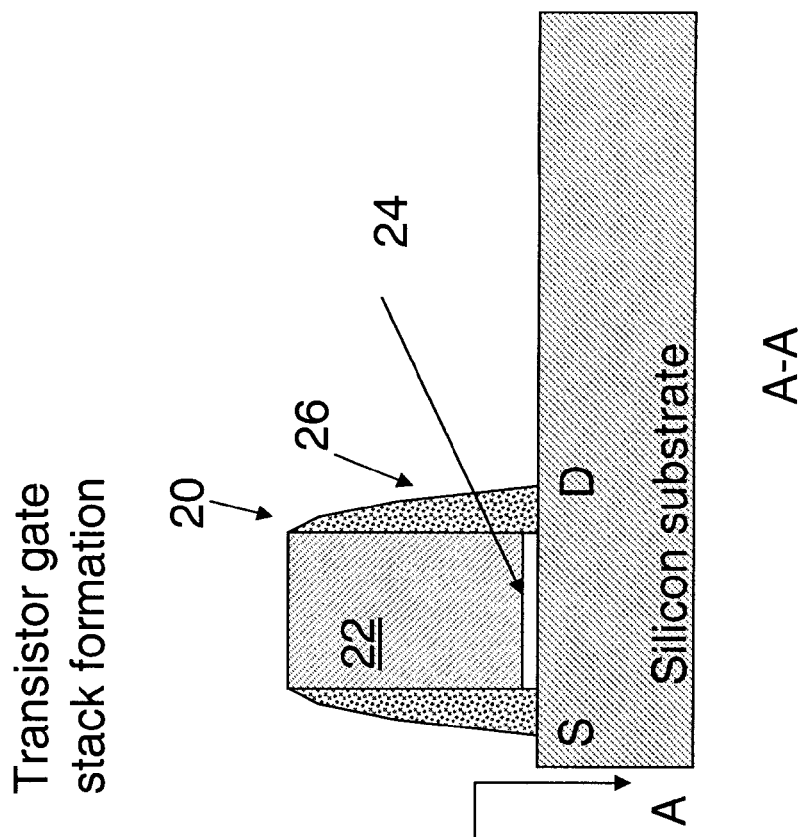
Figure 3A:
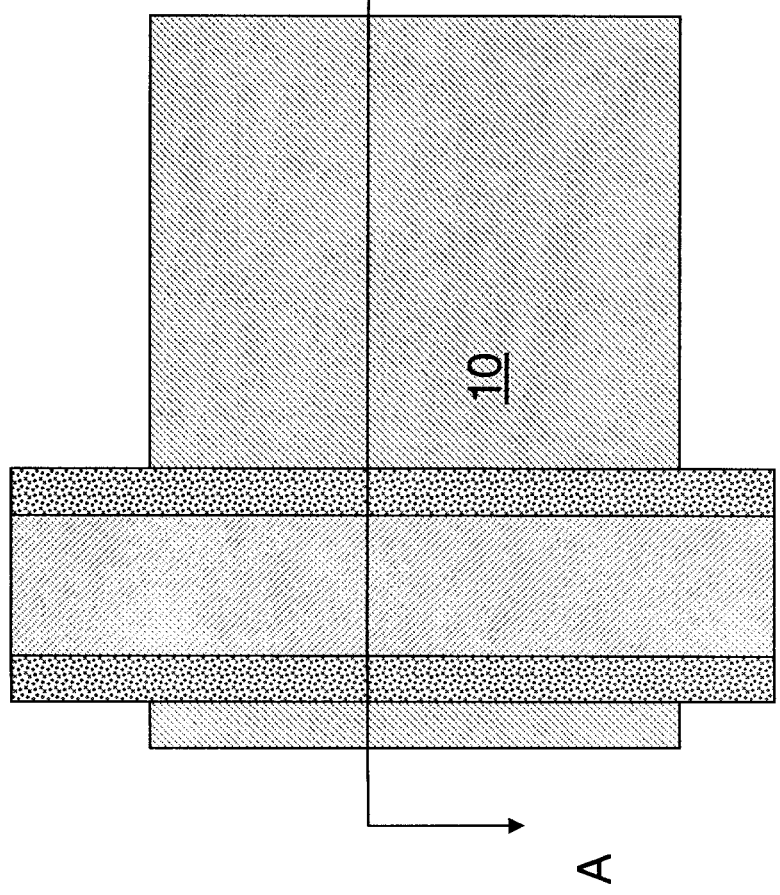
Figure 4:
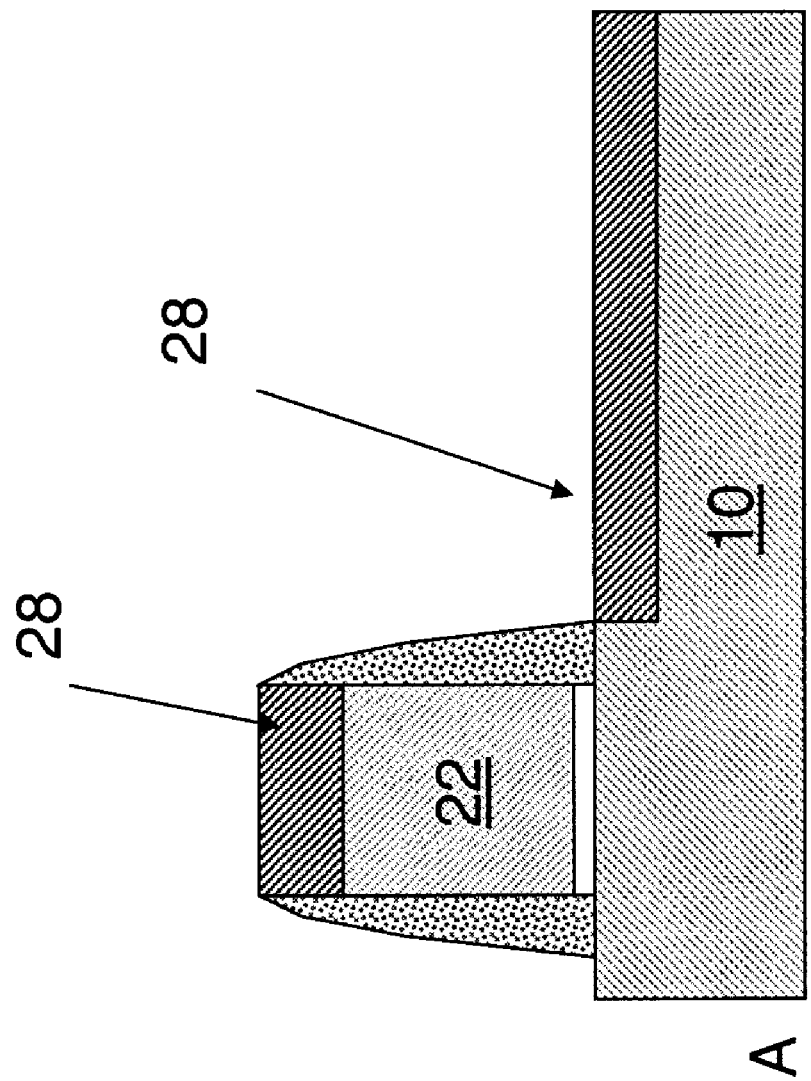
FIGS. 4 and 5 are additional side sectional schematic views of further sequential intermediate structural arrangements formed while practicing the methods to produce arrangements according to the present invention.

In FIG. 3A and the cross-sectional view through a line A-A (FIG. 3B), at least one MOS device 20 is formed on the substrate 10 in any conventional fashion. The MOS device 20 includes a gate stack having a polysilicon gate 22 formed on a gate oxide 24 disposed on the substrate 10. Alternatively, the gate 22 is a metal gate. Spacers 26 are formed from a dielectric material in any conventional fashion. The device 20 undergoes routine doping/implantation to form source and drain conductive regions S,D and extensions (not shown).

Next, the device 20 includes silicide contacts 28 formed in any conventional fashion on both the gate 22 and in a conductive region adjacent the MOS device which in this case is a MOSFET such as NFET. Additional silicide contacts (not shown) may be formed in other conductive regions, such as the source regions S. See the side sectional schematic view of FIG. 4. Forming the MOS device 20 includes various steps of layer depositions, etchings, dopings (carrier introductions), and silicidings which are conventional, well known and need not be discussed further. For more details for MOS or CMOS device fabrication, see, for example, U.S. Pat. No. 6,548,877 B2, METAL OXIDE SEMICONDUCTOR FIELD EFFECT TRANSISTOR FOR REDUCING RESISTANCE BETWEEN SOURCE AND DRAIN, by Yang et al., issued Apr. 15, 2003, and U.S. Pat. No. 6,028,339, DUAL WORK FUNCTION CMOS DEVICE, by Frenette et al., issued Feb. 22, 2000, which are both hereby incorporated in their entireties by reference.

Figure 5:
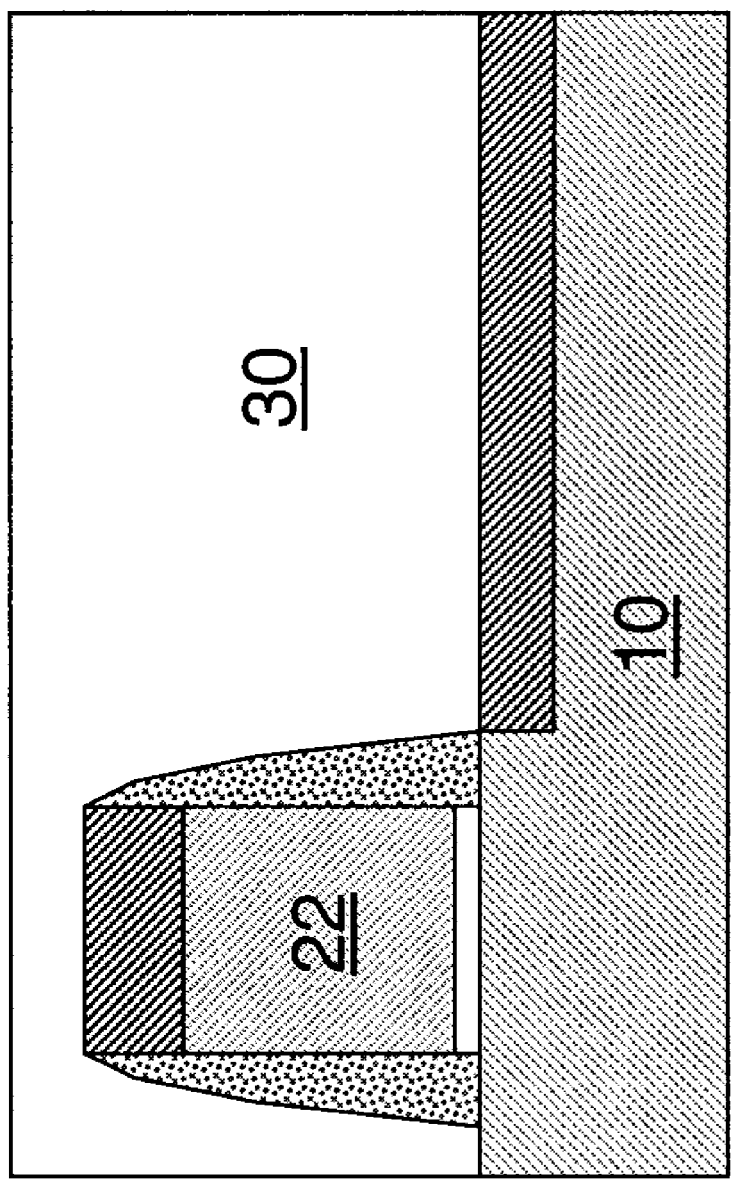
Figure 6:
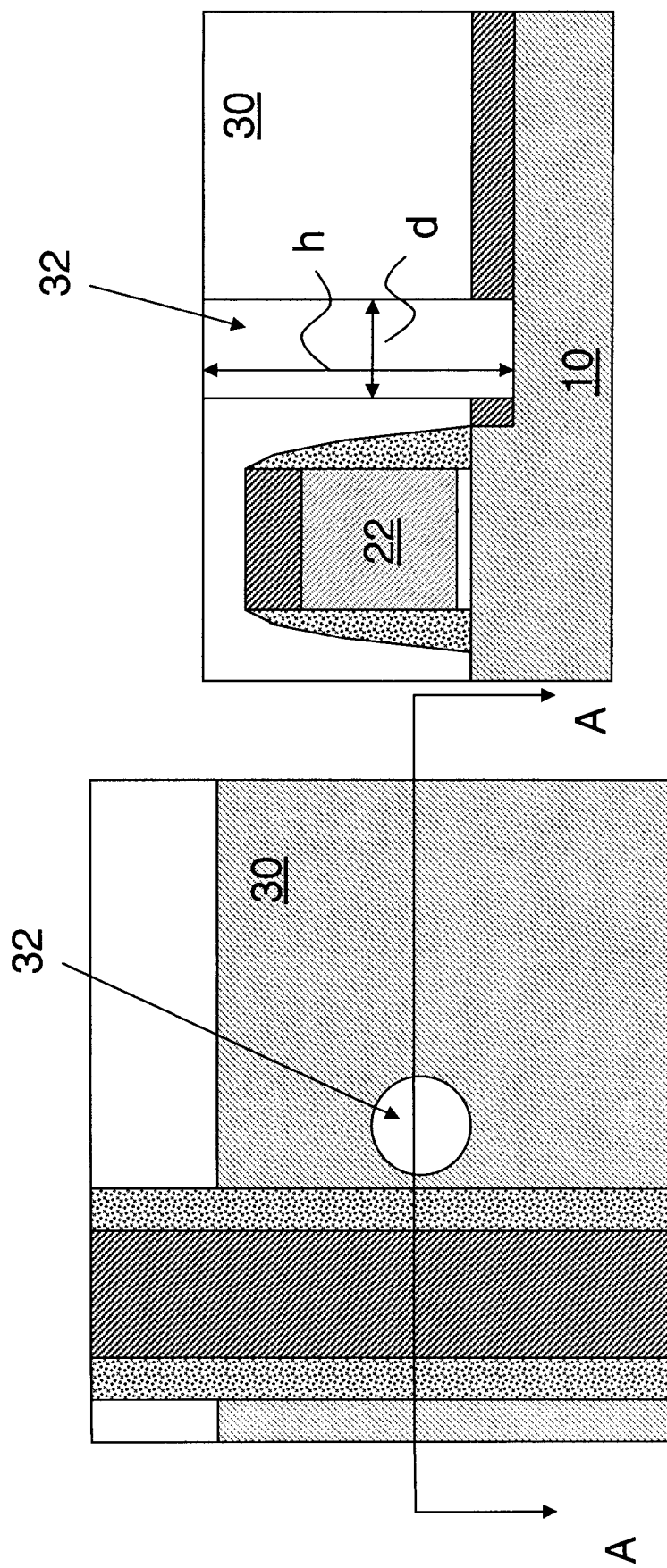
FIG. 6A and FIG. 6B are additional top planar and side sectional schematic views of further sequential intermediate structural arrangements according to a first embodiment of the present invention.

Next, a conformal insulating layer 30 is deposited onto the intermediate structural arrangement as shown in the further cross-sectional schematic view of FIG. 5.

The layer 30 is, for example, an insulator such as a low k dielectric (e.g., having a dielectric constant of less than approximately 3.2). The layer 30 is, for example, a SiCHO dielectric material, and is deposited by any conventional technique such as PECVD or spin-on.

According to the present invention, a cavity or via 32 is formed through the layer 30, and in the first embodiment through the silicided electrical contact 28 to the substrate 10, as shown in the top planar view of FIG. 6A and the side cross-sectional view (FIG. 6B).

The cavity 32 is formed, for example, by etching such as using reactive ion etching (RIE) with a photoresist mask (not shown). In this first embodiment, the via 32 has an approximately cylindrical shape, an approximately uniform diameter d and an approximately uniform height h. The diameter d of the cavity 32 is selected from a range of diameters: approx. 50 nm to approx. 100 nm. The height h of the cavity 32 is selected from a range of heights: approx. 100 nm to approx. 180 nm.

Figure 7:
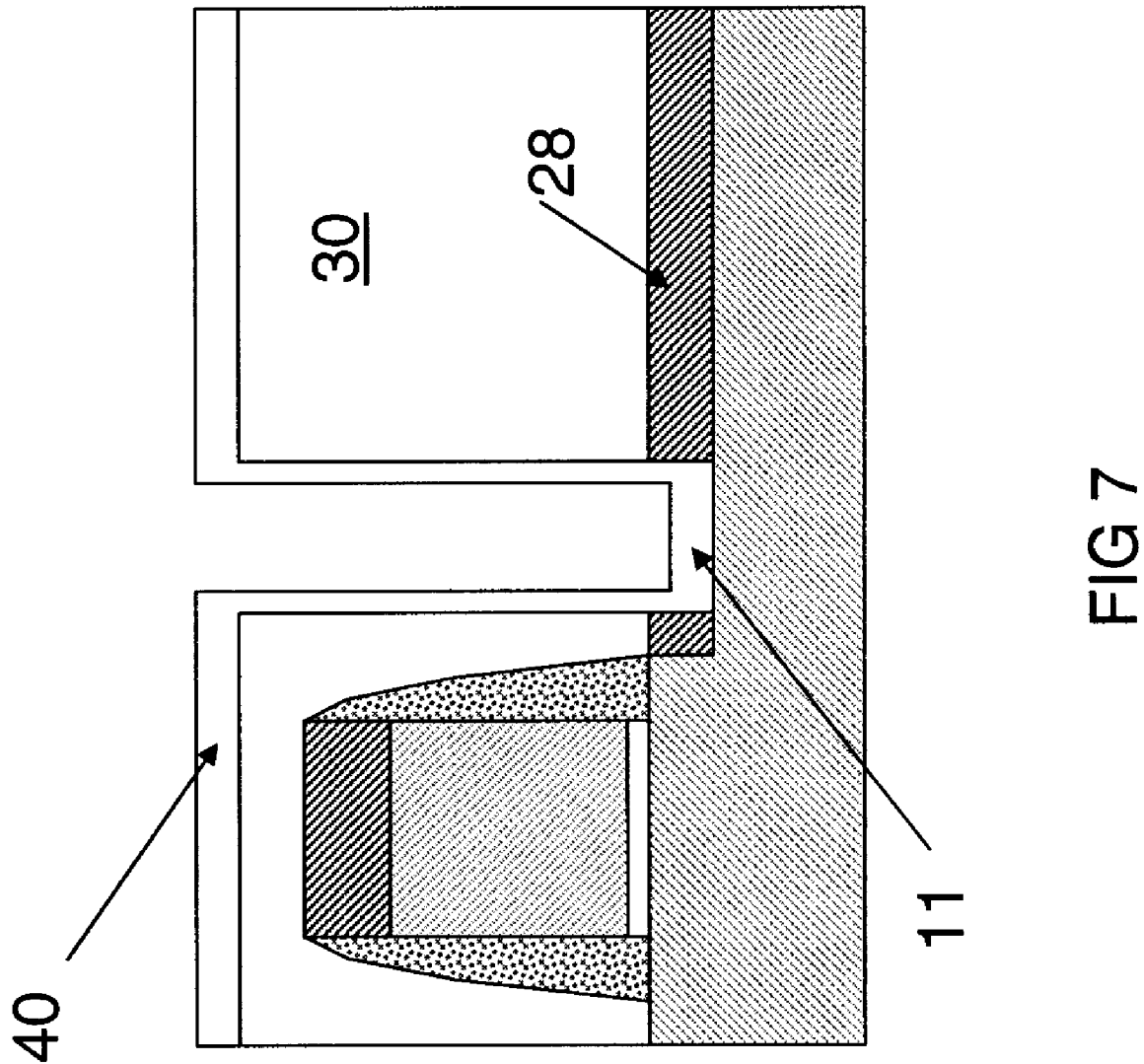
FIGS. 7, 8, 9, 10 and 11 are side sectional schematic views of additional sequential intermediate structural arrangements according to the first embodiment of the present invention.
Figure 8:
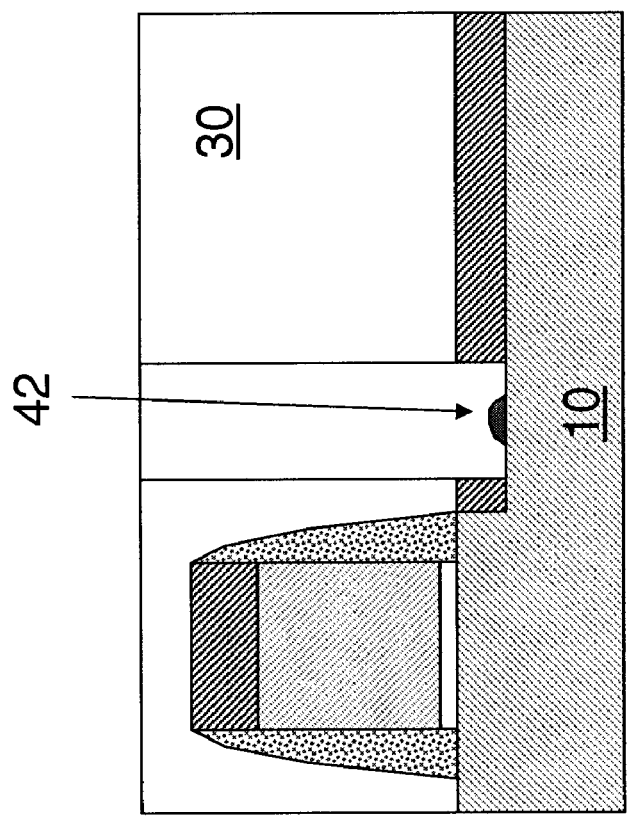
Figure 9:
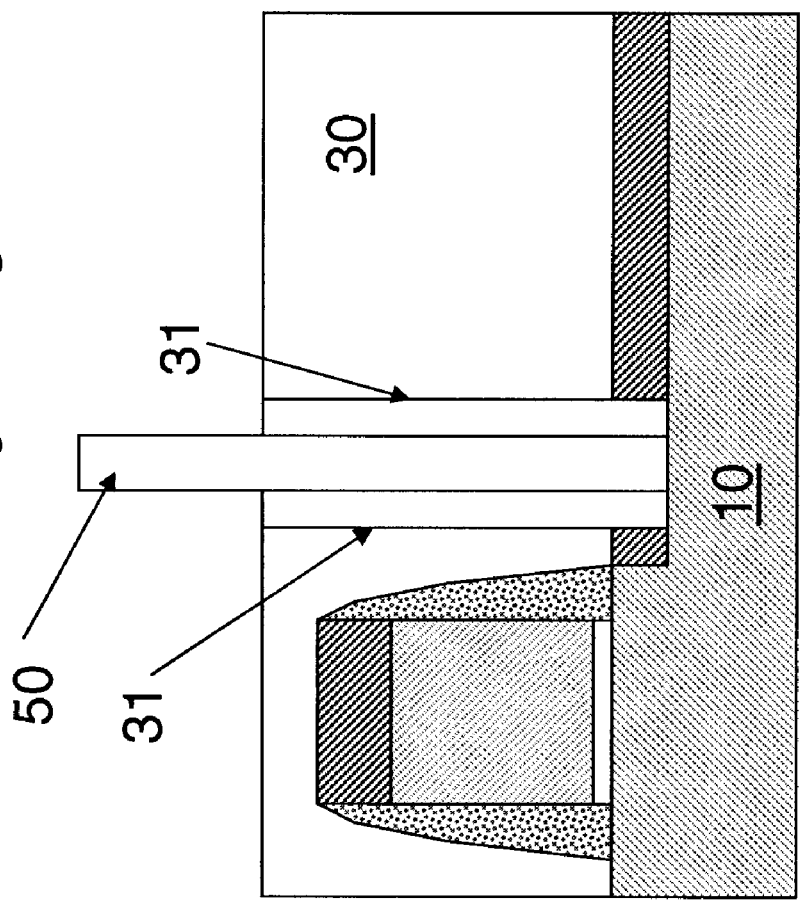

In FIG. 7, a conformal catalytic layer 40 is shown deposited onto the entire intermediate structural arrangement shown in FIG. 6A and FIG. 6B. The layer 40 is, for example, Ti or Ru and is deposited by physical vapor deposition (PVD), ion sputtering, or atomic layer deposition (ALD). PVD is a thin film deposition process in a gas phase in which a source material is physically transferred in a vacuum to the substrate 10 and other materials. The substrate 10 is located within a suitable chamber or reactor of conventional thin film process equipment (not shown). The layer 40 has a thickness in a range of approximately 5 nm to approximately 30 nm outside the cavity 32, and a thickness in a range of approximately 2 nm to approximately 10 nm inside the cavity 32. The thickness is approximately uniform.

Next, the structure shown in FIG. 7 is annealed to form a metal silicide at locations 11 where metal the 40 and the silicon 10 have a direct contact. A non-reacted portion of the layer 40 is removed by well-known techniques to form a seed portion 42 as shown in the cross-sectional schematic view of FIG. 8. Removal of the non-reacted portion of layer 40 is accomplished by, for example, selective wet etching using NH4OH and H2O2 containing solutions.

Next, a suitable nano-structure (e.g., a nano-wire 50 which is further processed to form a conductive nano-wire 50') is formed and arranged within the cavity 32, so as to be blowable responsive to a pre-determined electrical current I flowable through the nano-structure 50'. Factors which determine such current include (i) the composition of the nano-structure 50', (ii) the shape and dimensions of the nano-structure (e.g., height/length and width/diameter), (iii) the spatial relationship between major portions of the nano-structure and other structures in close proximity, and (iv) the remaining environment which contains the nano-structure 50'. According to embodiments of the invention: the remaining environment which contains the major portions MA (FIG. 11) of the structure (e.g., 50') consists essentially of a vacuum or an inert fluid; the structures in closest proximity to the major portions of the nano-structure are the barrier (e.g., 30,60), the contacts 28 and the substrate 10 (for the first embodiment of the invention).

Returning again to FIG. 8, to form the structure 50', a nano-wire 50 (e.g. Si) is formed within the cavity 32 and completely spaced from the surrounding walls 31 of the insulating layer 30 forming the cavity 32. Forming the nano-wire 50 is accomplished by known techniques such as exposing the structure of FIG. 8 to a silicon containing gas such as SiH4 or Si2H6 at a temperature ranging from 400 C to 600 C for a suitable time period. The wire 50 is made electrically conductive by known techniques such as suitably doping the wire during its formation and/or by suitable silicidation or otherwise by introducing electrically conductive material onto or into the nano-wire 50. For Si nano-wires, typical gaseous precursors include those commonly used for CVD of Si layers, namely $Si_2H_6$, $SiH_4$, $SiH_2Cl_2$, and $SiCl_4$, with the choice depending to a large extent on the reactor used and the ratio of catalyzed to uncatalyzed growth needed. Dopant gases, such as diborane ($B_2H_6$) and phosphine ($PH_3$) are added to control the resistivity of the nanowires. For further details, see FIG. 9 and FIG. 10 and the publications:

a) SELECTIVE VAPOR-LIQUID-SOLID EPITAXIAL GROWTH OF MICRO-SI PROBE ELECTRODE ARRAYS WITH ON-CHIP MOSFETS ON SI (111) SUBSTRATES, by Kawano et al., *IEEE Transactions on Electron Devices*, Vol. 51, No. 3, March 2004, ppgs. 415-420;

b) CATALYCTIC SYNTHESES OF SILICON NANOWIRES AND SILICA NANOTUBES, by Yang et al., 2004, *4th IEEE Conference on Nanotechnology*, ppgs. 448-450;

c) ELECTROLESS PLATING OF NICKEL ON CARBON NANOTUBES FILM, by Yung et al., 2005 *Electronics Packaging Technology Conference*, ppgs. 636-638, and d) CARBON NANOTUBE APPLICATIONS IN MICROELECTRONICS, by Hoenlein et al., *IEEE Transactions on Components and Packaging Technologies*, Vol. 27, No. 4, December 2004, ppgs. 629-634, which publications are all hereby incorporated in their entireties by reference.

Figure 10:
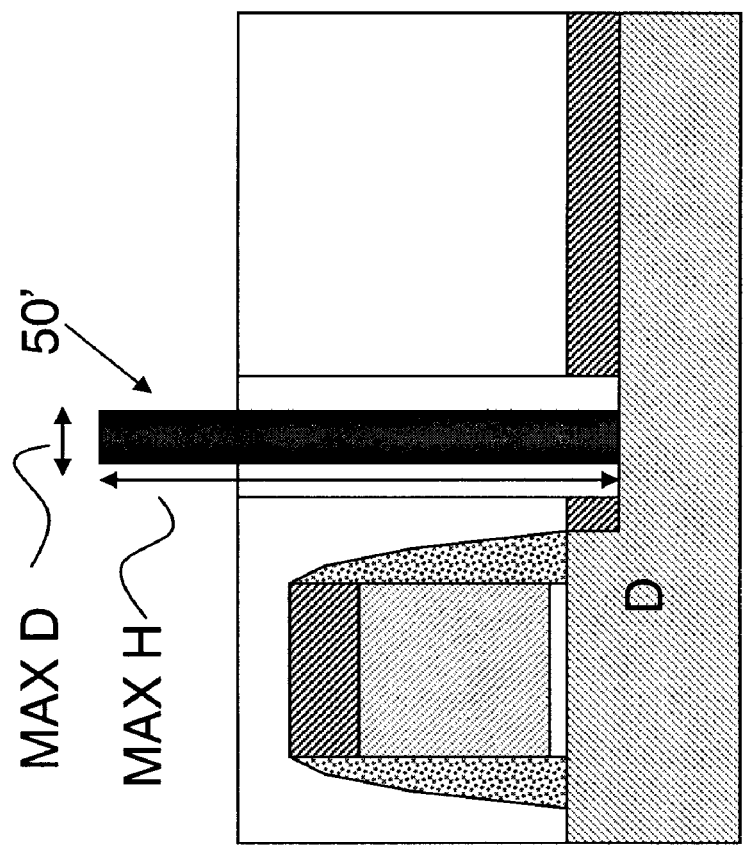

Electrically conductive nano-wire 50' is in electrically conductive contact with the electrically conductive region (e.g., D) of the substrate 10 as shown in FIG. 10.

Figure 11:
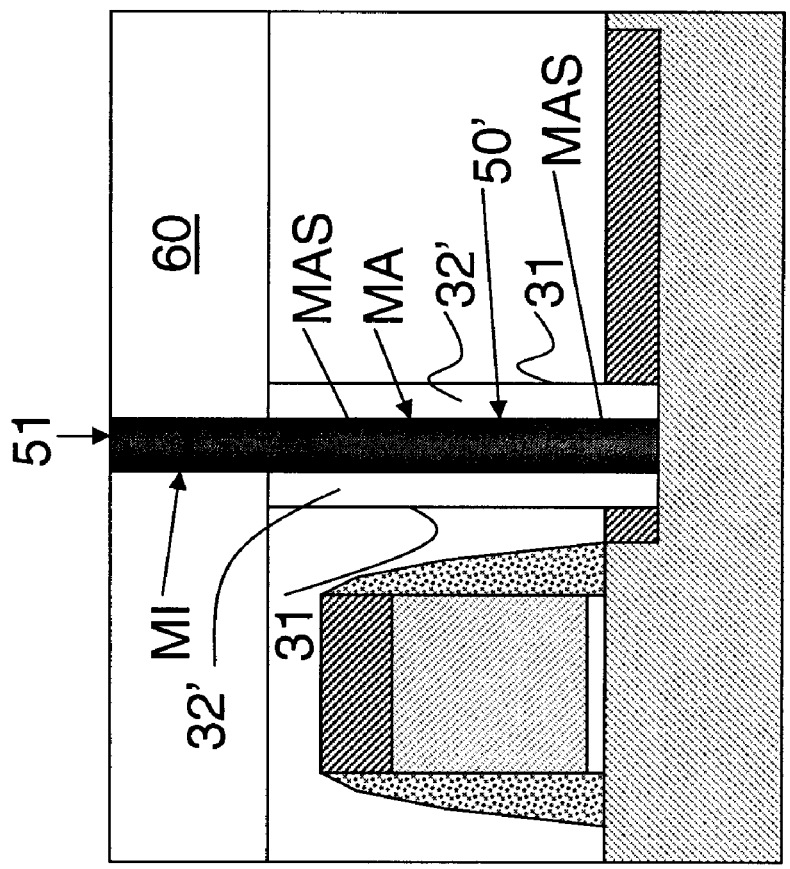

Next, deposit another conformal insulating layer 60 such as SiO2 or SiCHO in contact with outer surfaces of the nano-wire which project above insulating layer 30, and then remove the layer 60 to an extent such that an end 51 of the nano-wire 50' is exposed while the layer 60 continues to contact the outer surfaces of the nano-wire 50' above insulating layer 30. Removal is accomplished by CMP (chemical mechanical polishing) or other conventional removal techniques; see FIG. 11. In FIG. 11, the doped and/or silicided nano-wire 50' has major elongated portions MA and minor elongated portions MI in contact with the conformal insulating layer 60. The portion MA has elongated outermost surfaces MAS that are spaced approximately equal distances (arrows dd in FIG. 12) from the barrier walls 31. The minor elongated portion MI extends in a direction of the elongation of the major elongated portions. Because the nano-wire structural arrangement (e.g., FIG. 11) is formed within a closed processing environment (e.g., semiconductor processing chamber not shown), the spaces 32' completely surrounding the major surfaces MAS consist essentially of a vacuum or other desired fluid insulator such as an inert gas at suitable pressure. The inert gases include, for example, Argon, Nitrogen, or Helium.

In FIG. 11, according to the present invention, the portion MA of the nano-wire 50' within the cavity 32 is formed and arranged to break or blow responsive to a threshold current I flowing through the wire 50', the current having a magnitude selected from a range of approximately 4 µA to approximately 120 µA. The outermost dimensions of the final nano-wire 50' for these currents are: a maximum diameter MAXD selected from a range of approximately 10 nm to approximately 50 nm, and a maximum height MAXH selected from a range of approximately 100 nm to approximately 250 nm. The diameter is approximately uniform; the height is approximately uniform. When blown, the nano-wire 50' discharges particulate or blown material which is contained within the cavity 32 and which does not affect the device 20. Forming and arranging the wire 50', and the other embodiments of the present invention, are all well within the skill of the art in view of the instant specification and drawing figures.

Figure 12:
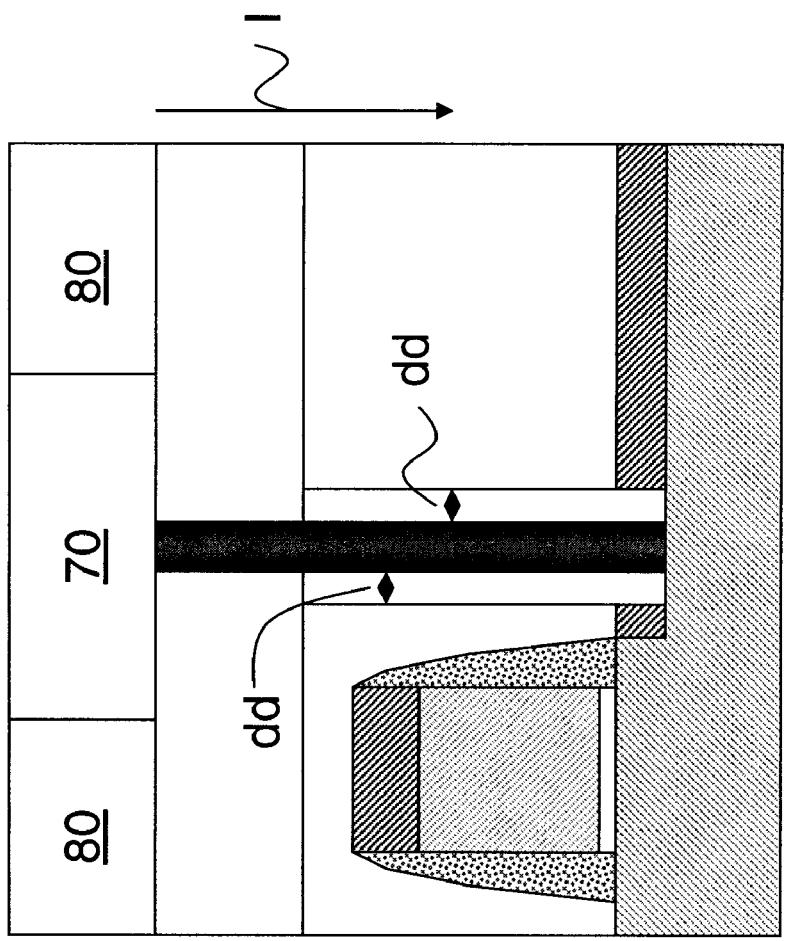
FIGS. 12, 17 and 23 are final structural arrangements according to the first, second and third embodiments, respectively, of the present invention.

Finally, in FIG. 12, a metal conductor 70 is conventionally formed in electrical contact with the end 51. The conductor 70 is, for example, copper, Tungsten or a metal silicide, and is formed by electroplating, chemical vapor deposition or ion sputtering. A layer 80 is an inter-layer dielectric layer including SiCHO and is deposited using conventional CVD process or spin-on method. The layer 80 typically is formed before forming the conductor 70.

Producing a second embodiment of the invention is shown in FIGS. 13-17, and producing a third embodiment of the invention is shown in FIGS. 18-23.

According to the second embodiment, the nano-structure is a doped and/or silicided nano-tube CNT'. According to the third embodiment, the nano-structure is a metal or metal alloy conductor C.

Figure 13:
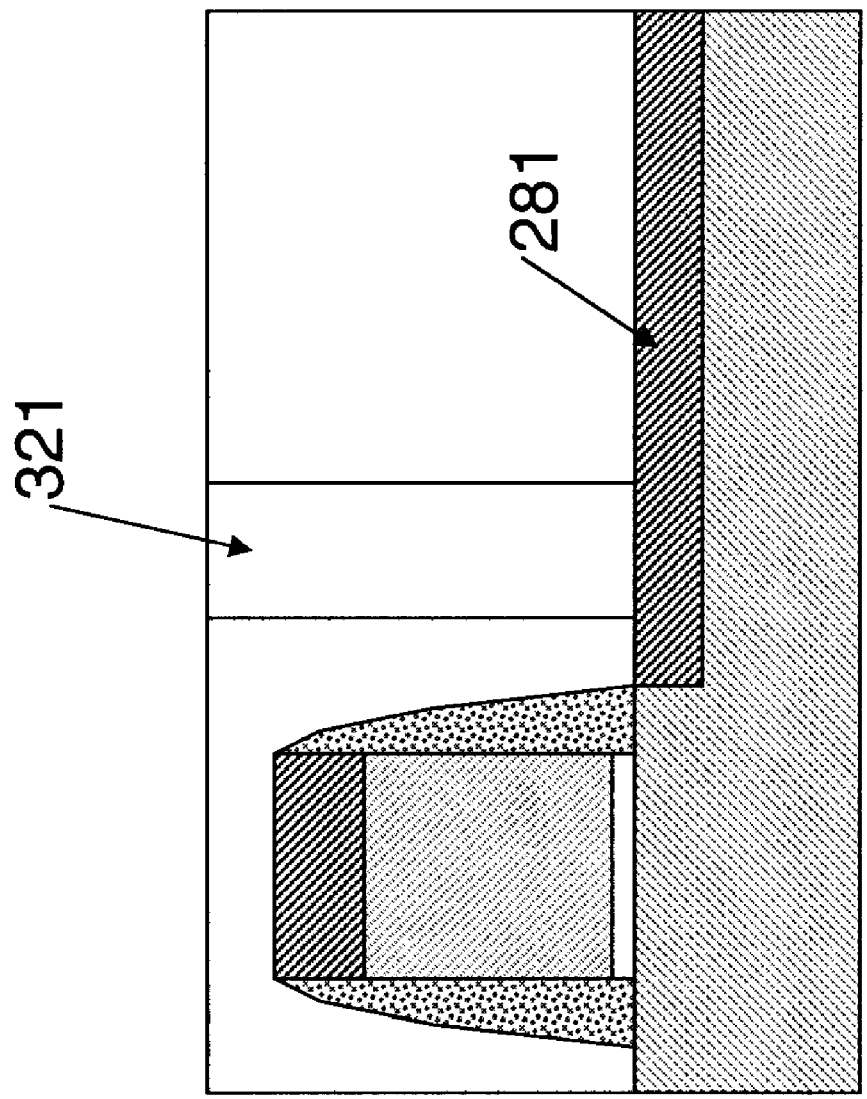
FIGS. 13, 14, 15 and 16 are side sectional schematic views of sequential intermediate structural arrangements according to the second embodiment of the present invention.
Figure 14:
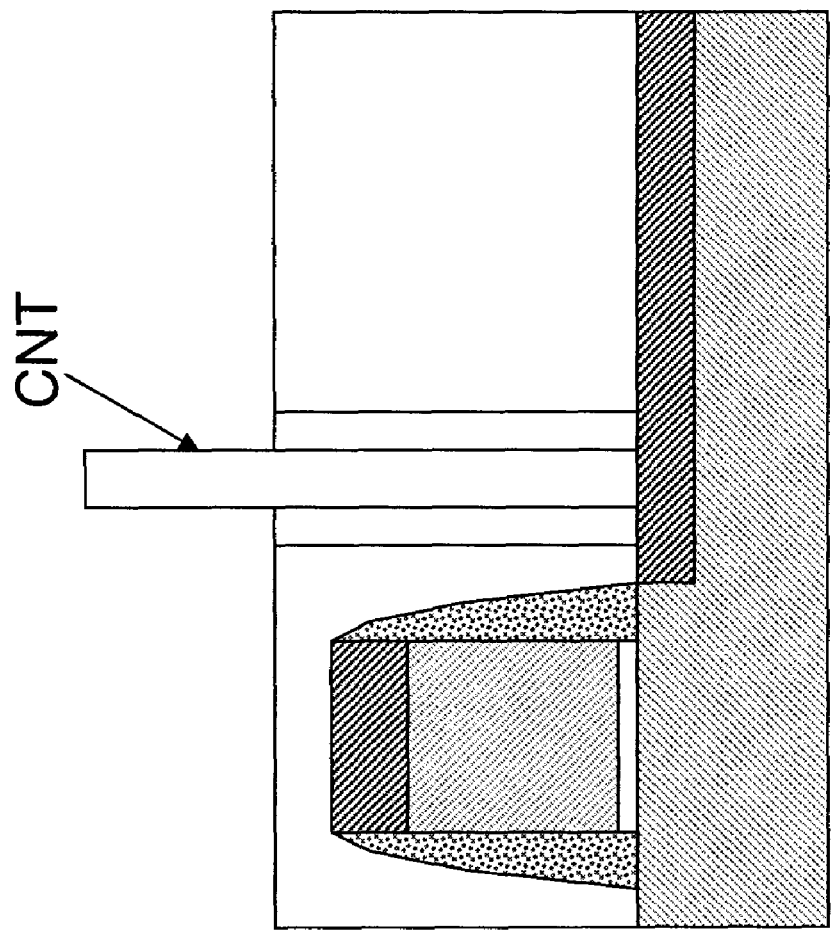
Figure 15:
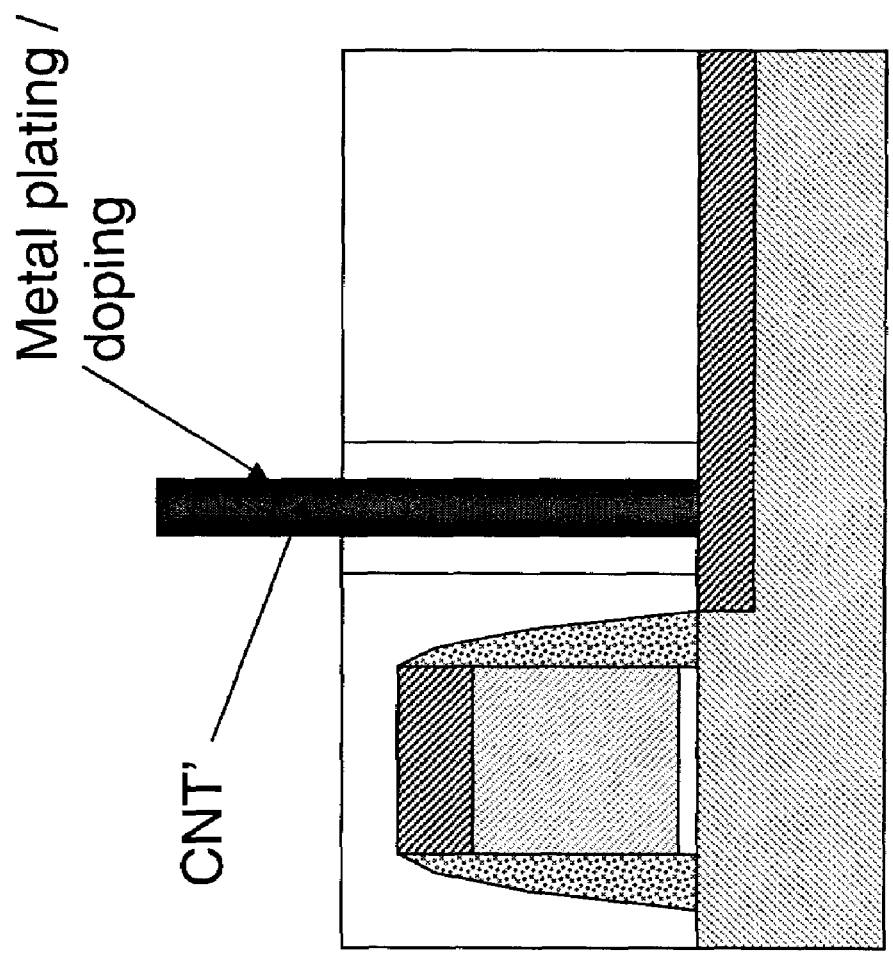
Figure 16:
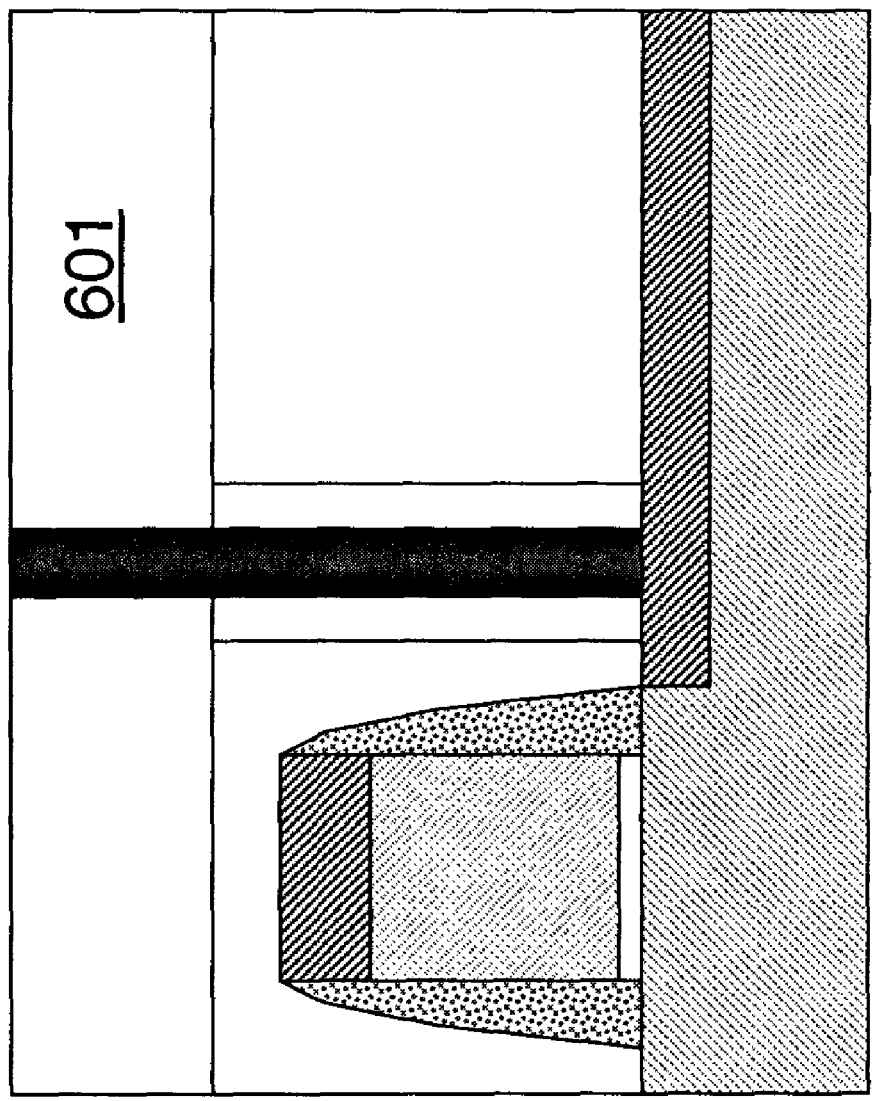
Figure 17:
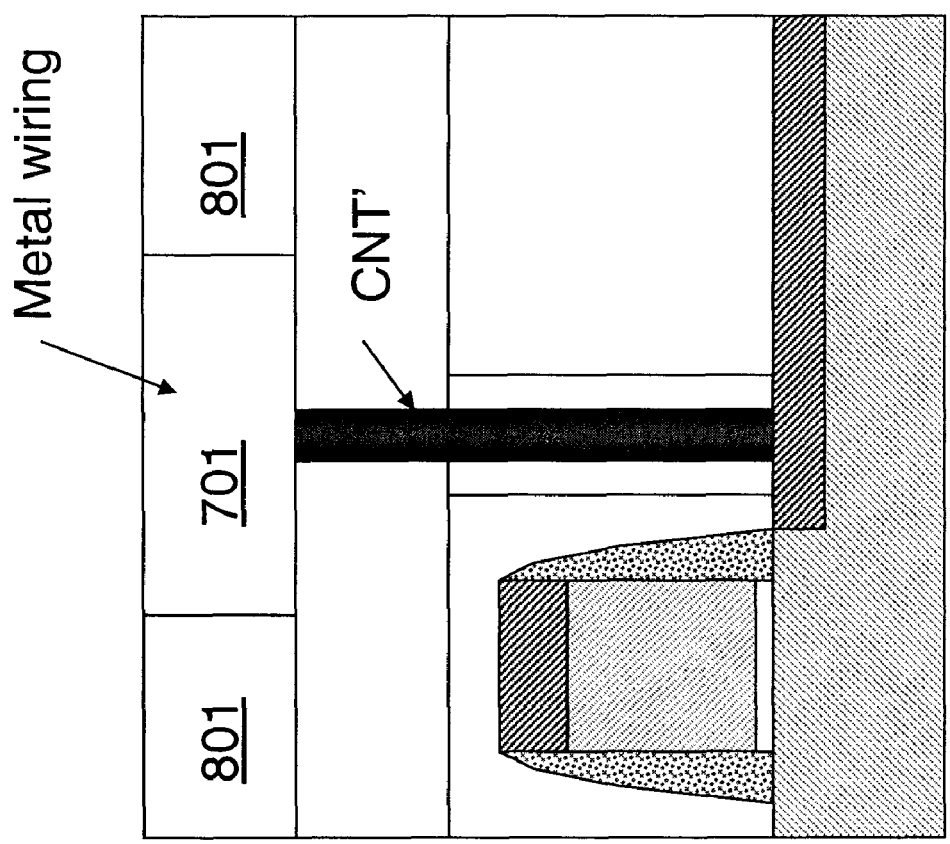
Figure 18:
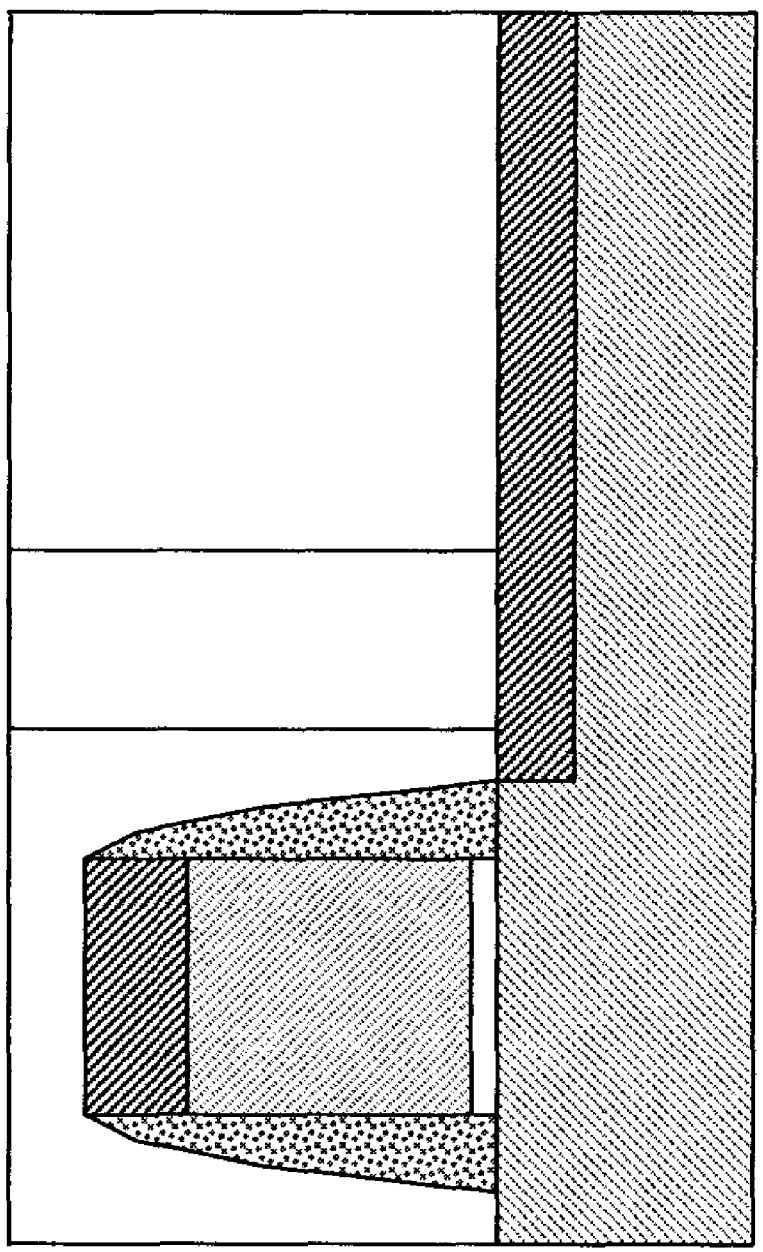
FIGS. 18, 19, 20, 21 and 22 are side sectional schematic views of sequential intermediate structural arrangements according to the third embodiment of the present invention.
Figure 19:
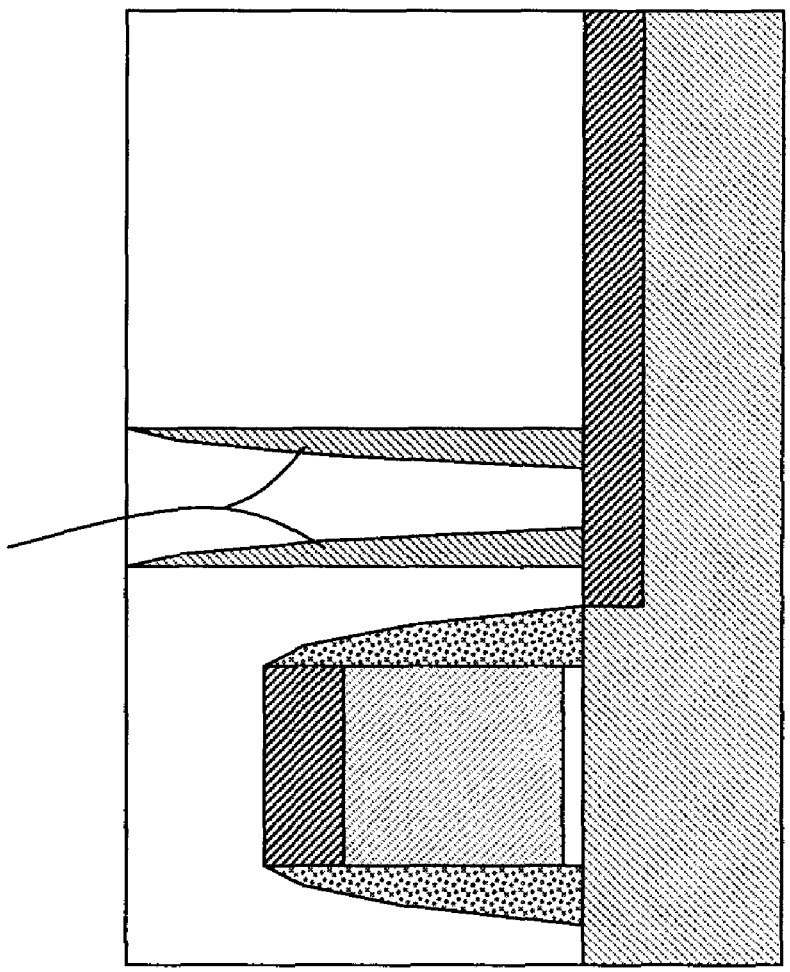
Figure 20:
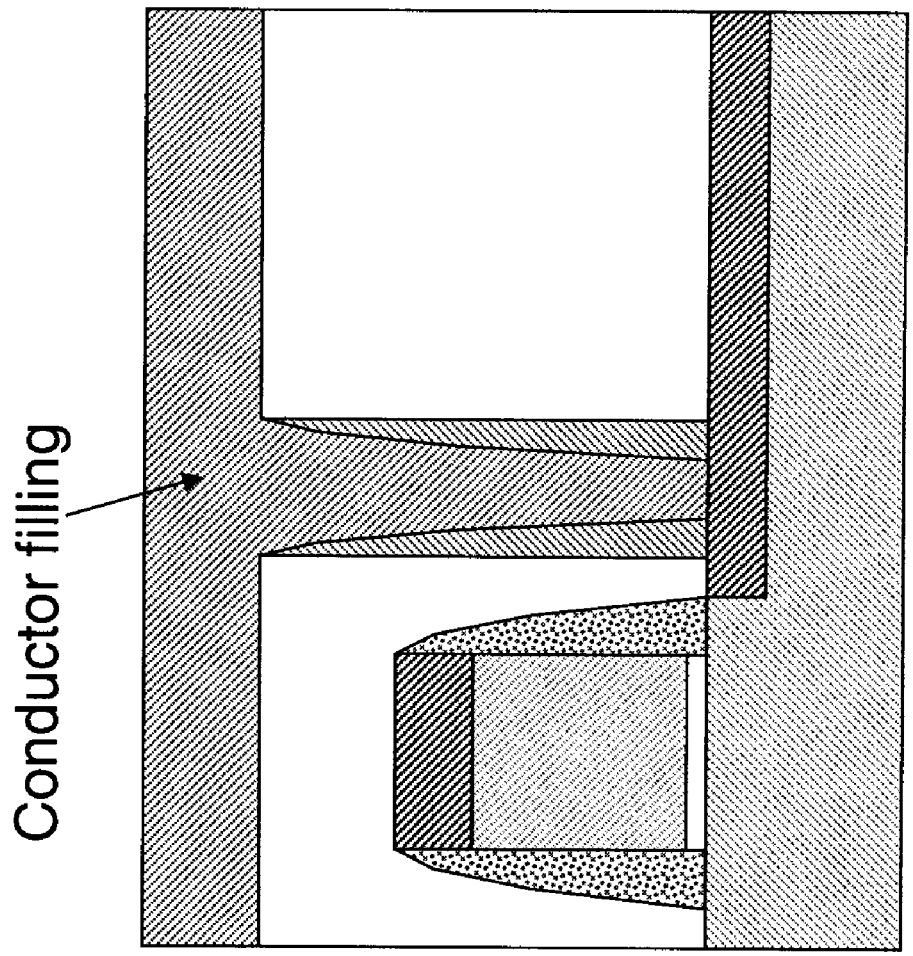
Figure 21:
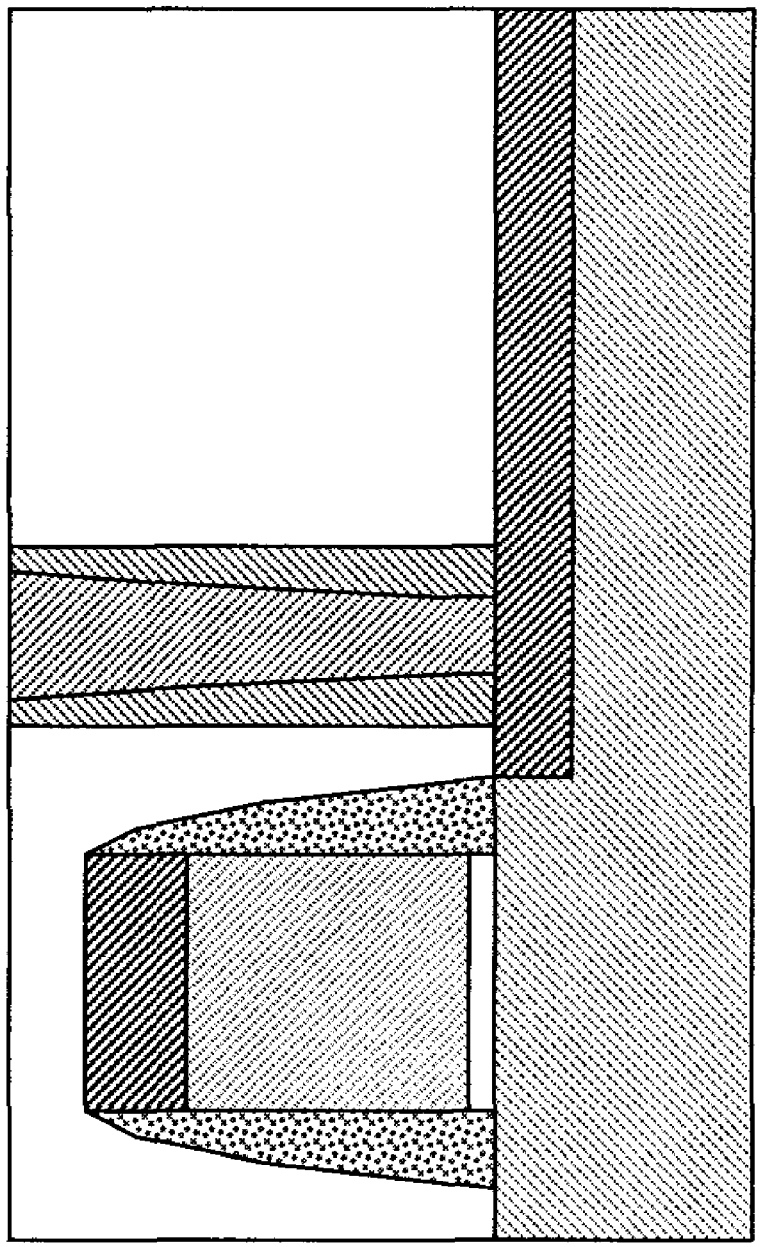
Figure 22:
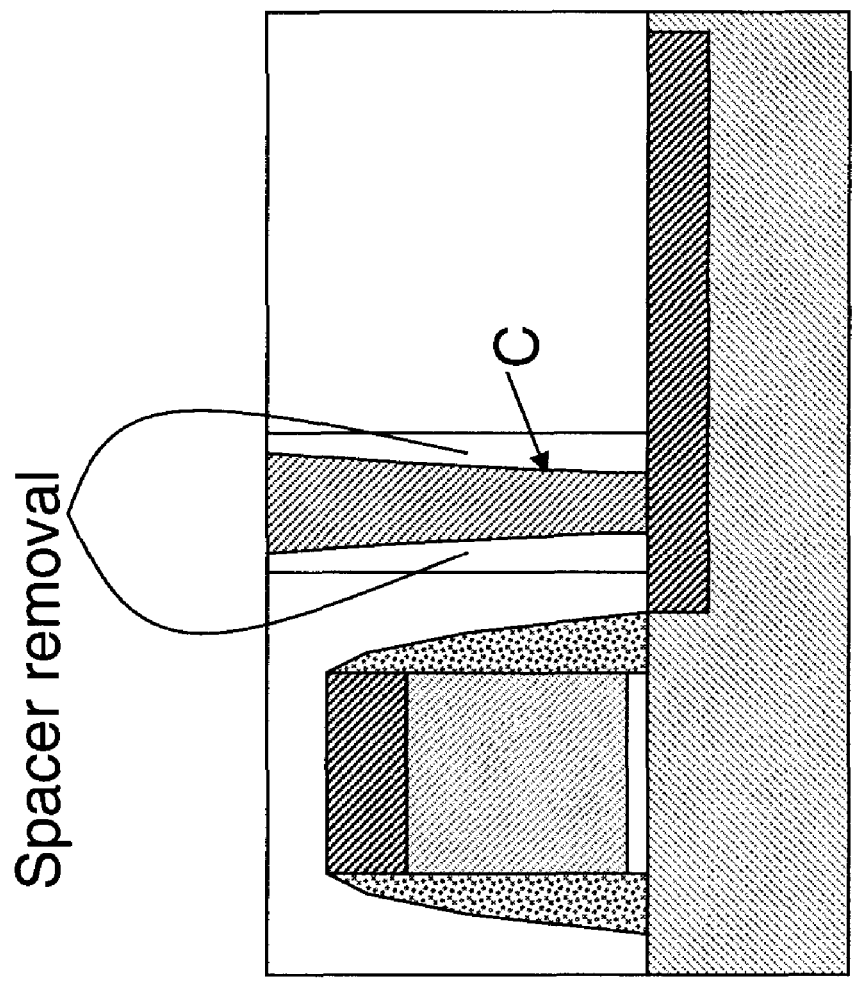

According to the second embodiment, FIGS. 13-17 show structures which result following the structure shown in FIG. 5. In this embodiment, a cavity 321 does not extend through a silicided contact 281 as shown in FIG. 13. A carbon nano-tube CNT is formed by known techniques on the contact 281 (FIG. 14), and then doped and/or silicided by known techniques (FIG. 15). Doping of the carbon nano-tubes can be done by using alkali metals, such as, but not limited to, Li, Na, K, Cs, and using mono-metallofullerene encapsulating lanthanide elements, such as, but not limited to, Ce, Nd, Gd, Dy, or by partial chemical functionalization using, for example, F, and/or substitutional doping using, for example, B and N, on the sidewalls of the carbon nano-tube. See also U.S. Patent Application Publication No. US 2005/0167755 A1, MICRO-CIRCUIT FABRICATION AND INTERCONNECTION, by Dubin et al., which is incorporated herein. Insulator 601 is deposited (FIG. 16), and then further insulator 801 and metal wiring 701 are formed (FIG. 17).

Figure 23:
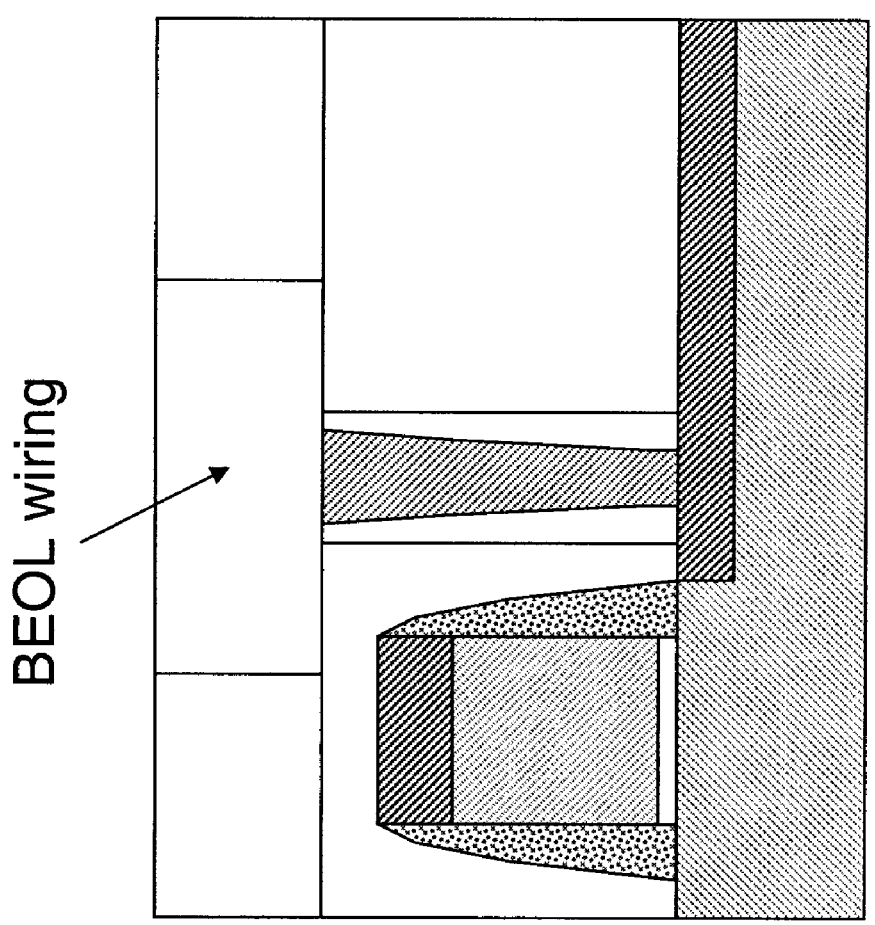
Figure 24:
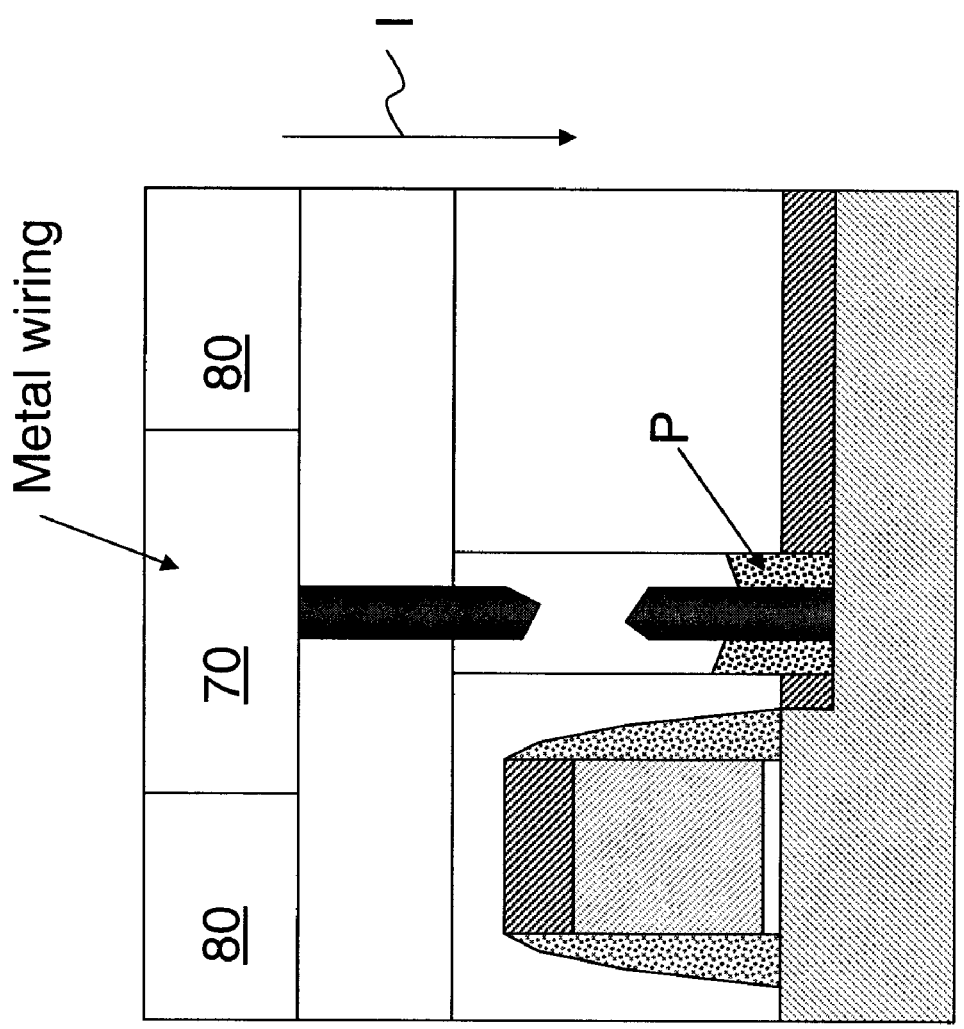
FIG. 24 is a side sectional schematic view of the arrangement of FIG. 12, after fuse link blow showing particulate material or blown portions P.

According to the third embodiment, FIGS. 18-23 show structures which result following the structure shown in FIG. 5. In FIG. 23, the nano-structure C is a conductor having a maximum diameter which decreases or tapers from one end of the conductor to an opposite end of the conductor as shown.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. A nano-fuse structural arrangement, comprising:
    a semiconductor substrate having an electrically conductive region formed thereon:
    an electrically conductive elongated nano-structure having a maximum diameter in a range of approximately 10 nm to approximately 50 nm and a maximum length in a range of approximately 100 nm to approximately 250 nm and being formed on the electrically conductive region;
    a barrier having barrier parts completely spaced from and completely surrounding elongated outer surfaces of the electrically conductive elongated nano-structure so as to define a cavity being at least one of evacuated or containing an electrically insulative fluid, the barrier parts being approximately equally spaced from the elongated outer surfaces,
    so that the electrically conductive elongated nano-structure is blowable responsive to an electrical current flowable through the electrically conductive elongated nano-structure in a range of approximately 4 μA to approximately 120 μA, and the spaces between the electrically conductive elongated nano-structure and the barrier are adapted to contain particulate or blown material from the electrically conductive elongated nano-structure when the electrically conductive elongated nano-structure is being blown.

2. The arrangement as claimed in claim 1, the electrically conductive elongated nano-structure including an electrically conductive nano-wire, and the approximately equal spaces being within a range of approximately 5 nm to approximately 20 nm.

3. The arrangement as claimed in claim 2, the electrically conductive elongated nano-structure including a carbon nano-tube having an external surface layer comprising a material selected from the group consisting of metals and metal silicides.

4. The arrangement as claimed in claim 1, the external surface layer being a metal selected from the group consisting essentially of Ni, Co, Pt, or Cu.

5. The arrangement as claimed in claim 1, the electrically conductive elongated nano-structure including a conductive dopant.

6. The arrangement as claimed in claim 1, the outer surfaces including metal silicide.

7. The arrangement as claimed in claim 1, the barrier including a dielectric material.

8. The arrangement as claimed in claim 1, the barrier including a low k dielectric material consisting essentially of SiCHO.

9. The arrangement as claimed in claim 1, the barrier further comprising a cap layer disposed over the spaces.

10. The arrangement as claimed in claim 1, the electrically conductive elongated nano-structure extending into the cap.

11. The arrangement as claimed in claim 1, the cap including a low k dielectric material.

12. The arrangement as claimed in claim 10, wherein the electrically conductive elongated nano-structure extends entirely through the cap.

13. The arrangement as claimed in claim 12, further comprising an electrically conductive layer being disposed on the cap layer and being in electrical contact with the electrically conductive elongated nano-structure.

14. The arrangement as claimed in claim 1, the electrical current being not greater than 60 μA.

15. The arrangement as claimed in claim 1, wherein a major elongated portion of the electrically conductive elongated nano-structure has outer surfaces spaced from the barrier to define the cavity, the arrangement further including an interlevel dielectric layer, wherein the electrically conductive elongated nano-structure further includes a minor elongated portion extending in a direction of the elongation of the major elongated portion, the minor elongated portion having outer surfaces contacted by the interlevel dielectric layer.

16. The arrangement as claimed in claim 1, wherein the cavity is evacuated.

17. The arrangement as claimed in claim 1, wherein the cavity contains an electrically insulative fluid.

18. A nano-fuse structural arrangement, comprising:
    a semiconductor substrate;
    an electrical contact disposed on the semiconductor substrate;
    an electrically conductive elongated nano-structure formed on the electrical contact, the electrically conductive elongated nano-structure having a maximum diameter of less than approximately 20 nm and a maximum length in a range of approximately 100 nm to approximately 250 nm;
    a protective barrier having parts completely surrounding outermost major elongated portions of the electrically conductive elongated nano-structure, the parts of the protective barrier comprising a dielectric material and being completely spaced from outermost surfaces of the elongated portions of the electrically conductive elongated nano-structure to define a cavity being at least one of evacuated or containing an electrically insulative fluid, the electrically conductive elongated nano-structure being formed and arranged such that the electrically conductive elongated nano-structure is blowable responsive to an electrical current flowable therethrough in a range of approximately 4 μA to approximately 120 μA, and the space between the electrically conductive elongated nano-structure and the protective barrier is adapted to contain particulate or blown material from the electrically conductive elongated nano-structure when the electrically conductive elongated nano-structure is being blown.

19. The arrangement as claimed in claim 18, the surfaces having a minimum spacing from the dielectric material in a range of approximately 5 nm to approximately 20 nm.

20. The arrangement as claimed in claim 18, wherein the cavity contains an electrically insulative fluid.

21. The arrangement as claimed in claim 18, wherein the major elongated portion of the electrically conductive elongated nano-structure has outer surfaces spaced from the protective barrier to define the cavity, the arrangement further including an interlevel dielectric layer, wherein the electrically conductive elongated nano-structure further includes a minor elongated portion extending in a direction of the elongation of the major elongated portion, the minor elongated portion having outer surfaces contacted by the interlevel dielectric layer.

* * * * *